United States Patent
Katoh et al.

(10) Patent No.: US 8,213,146 B2
(45) Date of Patent: Jul. 3, 2012

(54) SEMICONDUCTOR POWER CONVERSION APPARATUS

(75) Inventors: Shuji Katoh, Hitachiota (JP); Toshihiko Matsuda, Hitachi (JP); Takashi Ikimi, Hitachi (JP); Hiroshi Nagata, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/870,309

(22) Filed: Aug. 27, 2010

(65) Prior Publication Data

US 2010/0321847 A1 Dec. 23, 2010

Related U.S. Application Data

(63) Continuation of application No. 11/861,500, filed on Sep. 26, 2007, now abandoned.

(30) Foreign Application Priority Data

Sep. 27, 2006 (JP) ................................. 2006-261653

(51) Int. Cl.
*H02H 3/20* (2006.01)
(52) U.S. Cl. .................................................... 361/91.5
(58) Field of Classification Search ............... 361/91.5
See application file for complete search history.

(56) References Cited

U.S. PATENT DOCUMENTS

| | | | |
|---|---|---|---|
| 5,001,373 A | 3/1991 | Bator et al. | |
| 5,581,432 A | 12/1996 | Wellnitz et al. | |
| 5,608,595 A | 3/1997 | Gourab et al. | |
| 6,373,731 B1 | 4/2002 | Iwamura et al. | |
| 6,462,382 B2 | 10/2002 | Yoshida et al. | |
| 6,633,473 B1 | 10/2003 | Tomomatsu | |
| 2003/0086227 A1 | 5/2003 | Coiret et al. | |
| 2003/0086231 A1 * | 5/2003 | Asaeda et al. | 361/93.9 |
| 2004/0095699 A1 | 5/2004 | Kohno | |

FOREIGN PATENT DOCUMENTS

| | | |
|---|---|---|
| EP | 0902537 A2 | 3/1999 |
| JP | 09-163583 | 6/1997 |
| JP | 11-017831 | 1/1999 |

OTHER PUBLICATIONS

Office Action in CN 2007-10162922.2, dated Apr. 3, 2009.

* cited by examiner

*Primary Examiner* — Ronald W Leja
(74) *Attorney, Agent, or Firm* — Antonelli, Terry, Stout & Kraus, LLP.

(57) ABSTRACT

A semiconductor power conversion apparatus capable of protecting an IGBT from an overvoltage by supplying a sufficient gate current to the gate of the IGBT. The IGBT is protected from the overvoltage by connecting clamping elements connected in series between a collector of the IGBT and the gate thereof, and by connecting a resistor to each of different junction points between the clamping elements connected in series.

6 Claims, 10 Drawing Sheets

SEMICONDUCTOR POWER CONVERSION APPARATUS

This is a continuation application of U.S. patent application Ser. No. 11/861,500, filed Sep. 26, 2007 now abandoned, the entire content of which is hereby incorporated by reference into this application.

BACKGROUND OF THE INVENTION

The present invention relates to semiconductor power conversion apparatuses using semiconductor elements and, more particularly, to a semiconductor power conversion apparatus which suppresses an overvoltage upon switching operation.

In such a semiconductor power conversion apparatus having a MOS (Metal Oxide Semiconductor) gate semiconductor, such as an IGBT (Insulated Gate Bipolar Transistor) power conversion apparatus, an IGBT element (device) is switched to achieve AC/DC power conversion, DC voltage conversion, AC voltage/frequency conversion, etc. However, when the IGBT is turned OFF, an energy, accumulated in the parasitic inductance of a wiring line when a current flows therethrough, causes a surge voltage to be applied to the IGBT. A method of preventing the destruction of the IGBT element caused by the surge voltage induced upon the turning off of the IGBT, that is, by the overvoltage applied to the IGBT, is disclosed, for example, in JP-A-11-17831. In the prior art, a series circuit of a clamping element and a resistor is provided between a collector of the IGBT and a gate thereof, so that the voltage of the IGBT exceeding the voltage of the clamping element causes a charging current to be supplied from the clamping element to the gate of the IGBT. And setting of a higher gate voltage for the IGBT causes the impedance of the IGBT to be reduced, thus protecting the IGBT from an overvoltage. In the prior art, further, such a means is disclosed as to provide a plurality of series circuits each having the clamping element and the resistor and to set different voltages for the respective clamping elements, thus supplying more charging current for a higher collector voltage. In general, even when a gate charging current is supplied from a clamping element, the current is shunted to a gate driver and thus it is impossible to secure a sufficient amount of the gate charging current. However, since the higher collector voltage can supply more charging current in the prior art, we can say that the prior art is excellent from the viewpoint of reliably protecting the IGBT from the overvoltage upon application thereof.

SUMMARY OF THE INVENTION

In order to reliably protect the IGBT from the overvoltage, it is necessary, when the overvoltage is applied to the IGBT, to quickly supply the charging current to the gate of the IGBT to increase the gate voltage and to reduce the impedance of the IGBT. To this end, it is required to minimize the impedance of wiring lines of the clamping element and the resistor connected between the collector of the IGBT and the gate thereof. The wiring impedance can be decreased by reducing the length of the wiring lines. Accordingly, for the purpose of shortening the wiring distance, a charging current supply circuit such as a series circuit of the clamping element and the resistor wired between the collector of the IGBT and the gate thereof is provided as close to the IGBT as possible. In order to arrange the series circuit of the clamping element and the resistor close to the IGBT, it is necessary to make compact the charging current supply circuit such as the series circuit of the clamping element and the resistor. In the prior art, however, since it is required to arrange a plurality of such series circuits each having the clamping element and the resistor, the size of the charging current supply circuit (overvoltage protection circuit) becomes large and therefore it is difficult to locate the charging current supply circuit close to the IGBT.

It is an object of the present invention to provide a technique for protecting an IGBT from an overvoltage by making an overvoltage protection circuit compact and supplying a charging current to a gate of the IGBT.

The object of the present invention is attained by providing a semiconductor power conversion apparatus which includes a MOS gate semiconductor and an overvoltage protection circuit connected between a collector of the MOS gate semiconductor and a gate of the semiconductor, wherein the overvoltage protection circuit has a plurality of clamping elements connected in series and a resistor is connected to each of anodes of the plurality of clamping elements.

The object of the present invention is also attained by providing a semiconductor power conversion apparatus which includes a MOS gate semiconductor and an overvoltage protection circuit connected between a collector of the MOS gate semiconductor and a gate of the semiconductor, wherein, as a current supplied from the overvoltage circuit is greater, the value of a saturation current of a semiconductor element at the output stage of a gate driver is smaller.

The above object of the present invention is also attained by providing a semiconductor power conversion apparatus which includes a MOS gate semiconductor and an overvoltage protection circuit connected between a collector of the MOS gate semiconductor and a gate of the semiconductor, wherein a reactor is connected between the overvoltage protection circuit and a gate driver.

The above object of the present invention is also attained by providing a semiconductor power conversion apparatus which includes a MOS gate semiconductor and an overvoltage protection circuit connected between a collector of the MOS gate semiconductor and a gate of the semiconductor, wherein the length of a wiring line between the overvoltage protection circuit and a gate driver is longer than a distance between the overvoltage protection circuit and the gate of an IGBT.

The object of the present invention is also attained by providing a semiconductor power conversion apparatus which includes a MOS gate semiconductor and an overvoltage protection circuit connected between a collector of the MOS gate semiconductor and a gate of the semiconductor, wherein the value of a current flowing into the gate is limited to a predetermined value.

When a voltage exceeding a clamping element voltage is applied across the collector of the IGBT and the gate of the IGBT, a charging current is supplied from a first resistor. When a voltage exceeding a voltage corresponding to two clamping element voltages is applied across the collector of the IGBT and the gate of the IGBT, a charging current is supplied also from a second resistor. Thus greater gate charging current can be supplied as the voltage is higher.

With such an arrangement, since the need of connecting the clamping elements in parallel can be eliminated and the number of such clamping elements can be reduced unlike the prior art, a charging current supply circuit (overvoltage protection circuit) can be made compact.

Further, more charging current to the gate can be secured by suppressing a current shunted or branched to the gate driver. Accordingly, by suppressing the current shunted or branched to the gate driver, the IGBT can be protected from an overvoltage even without any need of increasing the size of the overvoltage protection circuit.

DESCRIPTION OF THE EMBODIMENTS

Figure 1:
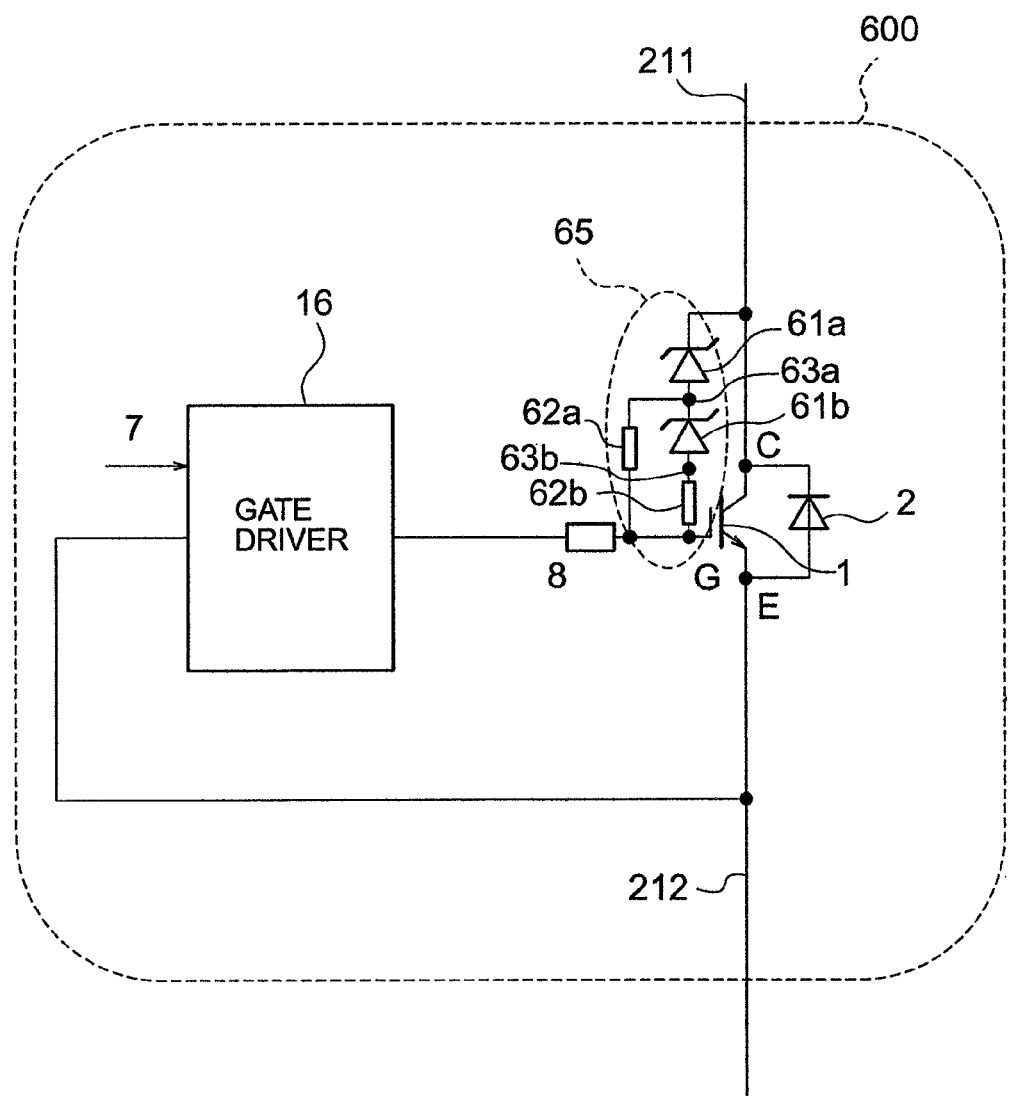
FIG. 1 shows a major part of an IGBT power conversion apparatus in accordance with a first embodiment of the present invention corresponding to one arm.

The present invention will be detailed in connection with embodiments of the invention with reference to the accompanying drawings. In the drawings for explaining the embodiments, constituent elements having the same functions are denoted by the same reference numerals or symbols. An emitter potential in each IGBT is used as a reference. In such a situation that an overvoltage is applied between a collector of the IGBT and an emitter thereof, a collector-to-emitter voltage is much higher than a gate-to-emitter voltage, and thus the collector-to-emitter voltage can be regarded as nearly the same as a collector-to-gate voltage. Thus the collector-to-emitter voltage and the collector-to-gate voltage will be both referred to as a collector voltage, hereinafter. In the following embodiments, explanation will be made in connection with an IGBT as an example. However, even when the IGBT is replaced by a MOS gate device, effects similar to those of the IGBT can be obtained.

Embodiment 1

Figure 5:
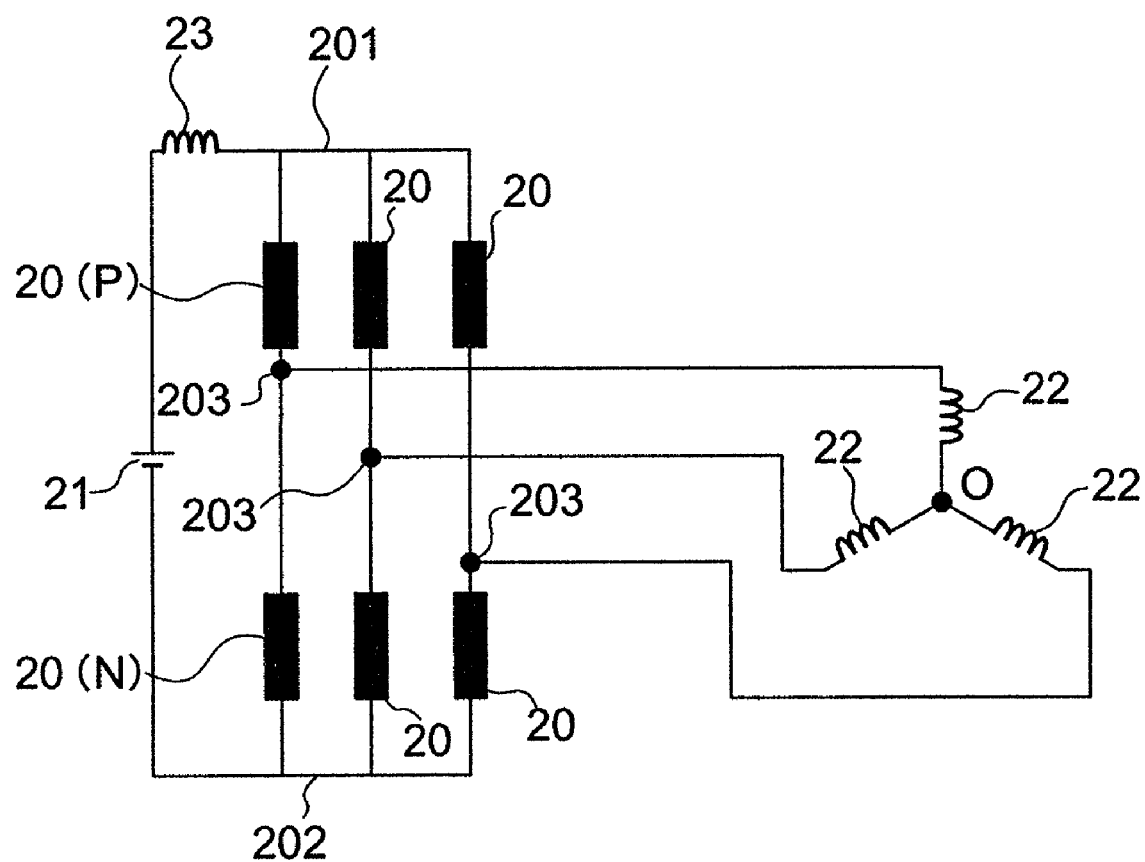
FIG. 5 shows a major part of the IGBT power conversion apparatus according to an embodiment of the present invention.

Explanation will be made first as to the arrangement of an IGBT power conversion apparatus in accordance with an embodiment with use of FIGS. 1 and 5. FIG. 5 shows a major part of the power conversion apparatus to which the present invention is applied, and FIG. 1 shows a major part of an arm 20 in FIG. 5.

First of all, the arrangement of the power conversion apparatus according to a first embodiment will be explained by referring to FIG. 5. In the power conversion apparatus of the present embodiment, 3 of two arms 20 connected in series are connected in parallel and also connected to a DC voltage source 21 via wiring lines 201 and 202. The wiring has been expressed by wiring lines 201 and 202. However, in order to reduce a parasitic inductance, the arm 20 is usually connected to the DC voltage source 21 via busbars or the like. As the DC voltage source 21, a DC capacitor may be used. Meanwhile, when the power conversion apparatus is an AC-to-DC conversion type, midpoints 203 between the paired two arms are usually connected to an AC system or an AC load via an impedance. In FIG. 5, as an example, the midpoint 203 of each arm is connected to a load 22 having an impedance. In this connection, the DC voltage source 21 or a wiring line connected between the DC voltage source 21 and the arm 20 has a parasitic inductance. In FIG. 5, such parasitic inductances are collected in a P (positive) side as a parasitic inductance 23. Although the 3-phase AC-to-DC conversion apparatus is illustrated in FIG. 5, the present invention is not limited to the 3-phase apparatus but may be effectively applied even to an AC-to-DC conversion IGBT power apparatus of a full bridge type or to a DC-to-DC IGBT power conversion apparatus such as a chopper apparatus.

The arrangement of the arm 20 will next be explained by referring to FIG. 1. In the drawing, a section surrounded by a large dotted line will be referred to as an IGBT set 600. In the present embodiment, Each of the arms 20 in FIG. 5 has such an arrangement as shown by the IGBT set 600 in FIG. 1. A wiring line 211 or 212 in FIG. 1 is connected to the wiring line 201 or 202 or to the midpoint 203 of the paired arms in FIG. 5. In the drawing, the wiring has been expressed by such wiring lines. For the purpose of reducing a parasitic inductance, however, the wiring line 211 and 212 are usually made in the form of a busbar, and are integrated with the wiring lines 201 and 202, respectively, and are not necessarily separated clearly as "wires", despite of the expression "wire".

The wiring lines 211 and 212 are connected with an IGBT 1. When the conversion apparatus is of an AC-to-DC conversion type, a flywheel diode 2 is connected to the IGBT 1 in an inverse parallel thereto in polarity. The gate of each IGBT 1 is connected to a gate driver 16 via a gate resistance 8. In this connection, the gate resistance 8 may be included in the gate driver 16.

An overvoltage protection circuit 65 is connected between the collector of the IGBT 1 and the gate thereof. The overvoltage protection circuit 65 includes a series circuit of clamping element 61a, 61b and a resistor 62b and also includes a resistor 62a connected between a junction point 63a and the gate of the IGBT 1.

Explanation will then be made as to the operation of the power conversion apparatus of the present embodiment. The gate driver 16 supplies an ON/OFF pulse to the IGBT 1 to switch the IGBT 1 on the basis of a signal 7 received from an upper-level control system. When the IGBT 1 is turned ON or OFF, the arm 20 is turned ON or OFF to generate an AC voltage, and the generated AC voltage is applied to the load 22 having the inductance. The paired arms, for example, the arms 20(P) and 20(N) are not turned ON at the same time.

Attention will now be paid to a situation when the arms 20(N) and 20(P) are alternately turned ON and OFF, a drive signal to the arm 20(P) is put in its ON state and a drive signal to the arm 20(N) is put in its OFF state. When a current is flowing through a path from the DC voltage source 21 via the arm 20(P) to the load 22 having the inductance and the arm 20(P) is turned OFF, a surge voltage is generated in the arm 20(P) at the wiring parasitic inductance 23 present in the path of a main circuit (DC voltage source 21→arm 20(P)→arm 20(N)→DC voltage source 21). And the surge voltage is superimposed on the voltage of the DC voltage source 21 and applied between the collector of the IGBT 1 and the emitter thereof.

Figure 9:
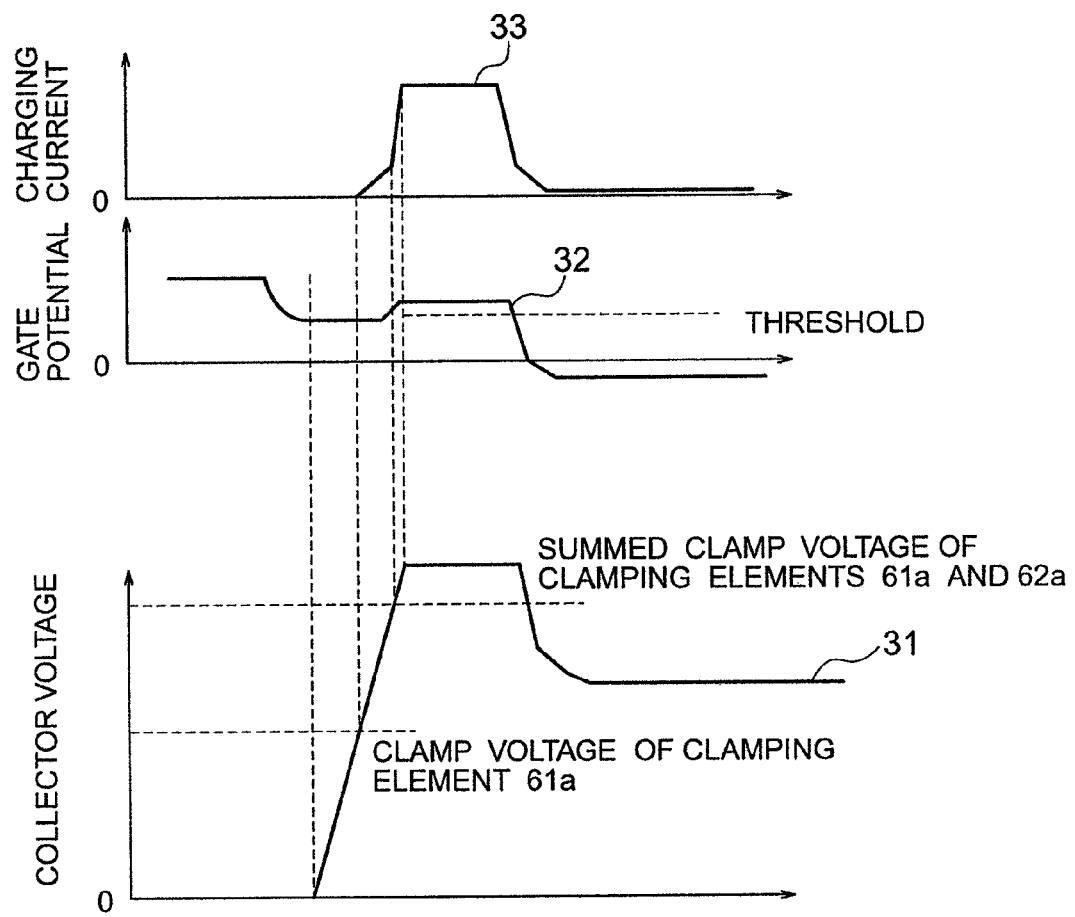
FIG. 9 is a diagram for explaining the operation of the first embodiment.

By referring to FIG. 9, explanation will be made in detail as to waveforms of a collector voltage of the IGBT 1 and of a gate voltage thereof when the IGBT 1 is turned OFF. It is assumed that the gate driver 16 outputs an off pulse to turn OFF the IGBT 1. When the gate driver 16 outputs the OFF pulse, that is, a potential not exceeding a threshold of the IGBT 1; this causes electric charges so far accumulated in the gate of the IGBT 1 to be pulled out through a gate resistance 8. This results in that a gate voltage 32 of the IGBT 1 is reduced, the IGBT 1 shifts to its turn-off state, and a collector voltage (collector-to-emitter voltage) 31 rises. When the collector voltage 31 of the IGBT 1 rises and becomes higher than the clamp voltage of the clamping element 61a, the clamping element 61a is conducted so that a charging current flows into the gate of the IGBT 1 through the clamping element 61a and the resistor 62a, thus increasing the gate voltage 32. However, since the charging current is partly shunted into the gate driver 16, the charging current cannot sufficiently contribute to increasing the gate voltage. When the collector voltage of the IGBT 1 is further increased before the gate voltage of the IGBT 1 becomes sufficiently high, and when the collector voltage exceeds a total of the clamp voltages of the clamping elements 61a and 61b; the clamping element 61b is also conducted so that the gate current can be supplied even through a path of the clamping element 61a, the clamping element 61b, and the resistor 62b. Thus, when the gate voltage of the IGBT 1 is further increased to reduce the impedance of the IGBT 1, the IGBT 1 can be protected from an overvoltage.

When the resistive value of the resistor 62b is set to be larger than that of the resistor 62a, the clamp voltage of the IGBT becomes high but the IGBT 1 can be protected from the overvoltage. When the overvoltage of the IGBT 1 is made high, the turn-off loss of the IGBT can be made small as a merit.

Embodiment 2

A second embodiment will next be explained. The present embodiment is directed to protecting the IGBT 1 from an overvoltage by limiting a current shunted from a clamping element to a gate driver and supplying more gate charging current from the clamping element to the gate of the IGBT 1.

Figure 2:
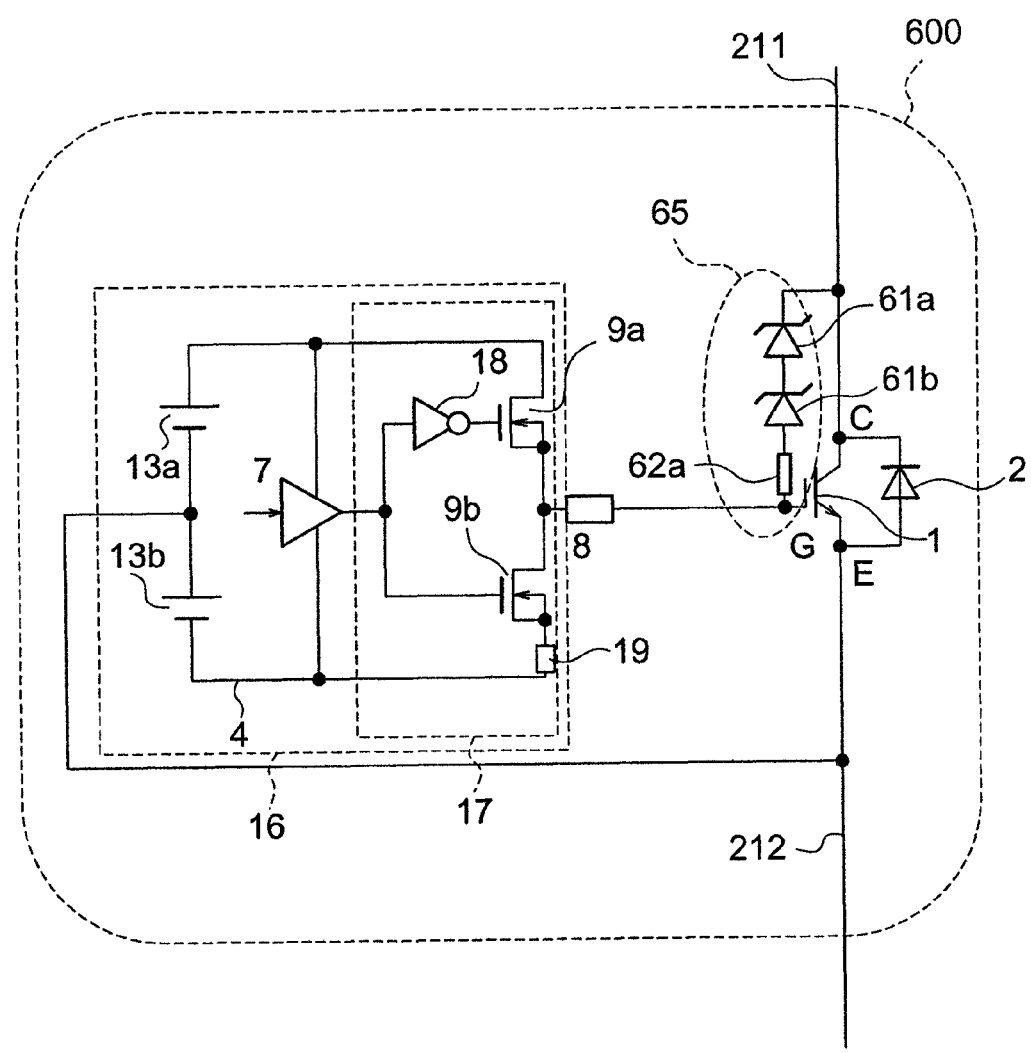
FIG. 2 shows a major part of an IGBT power conversion apparatus in accordance with a second embodiment of the present invention corresponding to one arm.

In the present embodiment, each arm 20 in FIG. 5 has such an arrangement as shown by an IGBT set 600 in FIG. 2. In the second embodiment, a resistor 19 is provided between a MOS FET 9b and a low-voltage side power line 4 of a gate driver 16 in an output stage of the gate driver. When a MOS FET 9a is turned ON and the MOS FET 9b is turned OFF, the gate potential of the IGBT 1 becomes a potential of a high-voltage side power line of the gate driver 16, the gate voltage of the IGBT 1 exceeds a threshold in such a manner that the IGBT is put in its ON state. When the MOS FET 9a is turned OFF and the MOS FET 9b is turned ON, on the other hand, charges are pulled out from the gate of the IGBT 1 via a gate resistance 8 into the gate driver 16, so that the IGBT 1 is turned OFF and put in its OFF state. When the IGBT 1 is turned OFF, the collector voltage of the IGBT 1 increases, the clamping element 61a yields or is broken down, a current flows through the clamping element 61a and even into the gate driver 16. At this time, flowing of a current through the resistor 19 causes a potential difference to occur between both ends of the resistor 19. The occurrence of the potential difference between the both ends of the resistor 19 causes a source potential of the MOS FET 9b to increase, with the result that a voltage between the gate and source of the MOS FET 9b drops. Since the gate-to-source voltage drops, the saturation current of the MOS FET 9b becomes small. The current flowing from the clamping element 61a is divided into the gate charging current of the IGBT 1 and into a current flowing into the gate driver 16 via the MOS FET 9b. Since the saturation current of the MOS FET 9b becomes small as mentioned above, the current flowing into the gate driver 16 is limited so that more current can be supplied to the gate of the IGBT 1. Accordingly, the IGBT can be protected more reliably from the overvoltage.

Although the overvoltage protection circuit 65 is made up of a series circuit including the clamping elements 61a, 61b and the resistor 62a in FIG. 2, the overvoltage protection circuit 65 may have such an arrangement as shown by the overvoltage protection circuit 65 in FIG. 1.

The saturation current value of the MOS FET 9b is set more preferably as follows.

In an IGBT set 600 similar in circuit arrangement to the IGBT set 600 in FIG. 2 but not having the overvoltage protection circuit preset therein, it is assumed that the maximum value of a current flowing through the MOS FET 9b when the IGBT is turned OFF is defined as a normal turn-off current value. Then, when the saturation current value of the MOS FET 9b is set not to be larger than the usual turn-off current value in FIG. 2, more charging current can be supplied to the gate of the IGBT 1.

When the resistive value of the resistor 19 is sufficiently small, the normal turn-off current value becomes nearly equal to a value obtained by dividing a potential difference (corresponding to a sum of voltages of voltage sources 13a and 13b) between the ON and OFF gate voltages by the resistive value of the gate resistance 8.

Embodiment 3

Explanation will next be made as to a third embodiment. Even in the present embodiment, a current branched from a clamping element to a gate driver is limited to supply more gate charging current to the gate of an IGBT 1, thus protecting the IGBT 1 from an overvoltage, similarly to the second embodiment.

Figure 3:
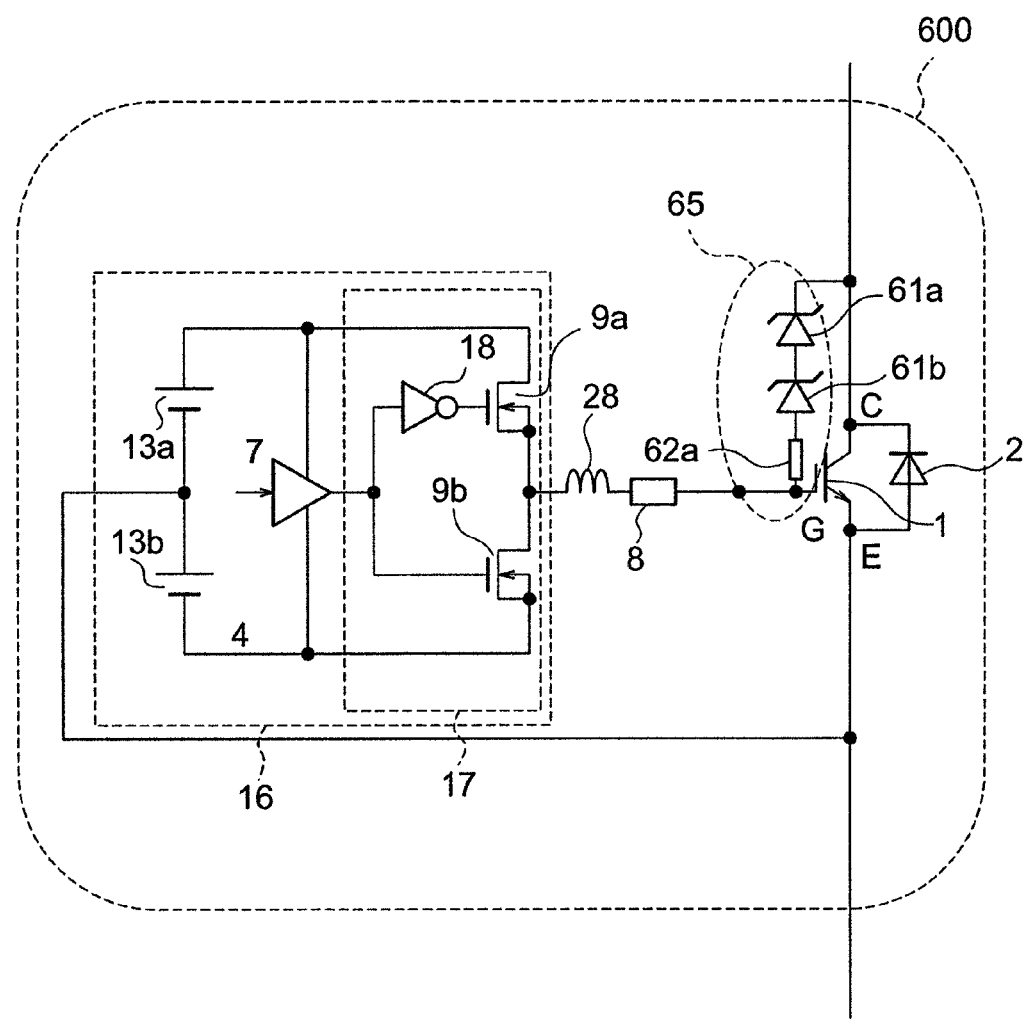
FIG. 3 shows a major part of an IGBT power conversion apparatus in accordance with a third embodiment of the present invention corresponding to one arm.

In the present embodiment, each arm 20 in FIG. 3 has such an arrangement as shown by the IGBT set 600 in FIG. 2. The third embodiment is featured in that a reactor 28 is connected between an overvoltage protection circuit 65 and a gate driver 16.

When a MOS FET 9a is turned ON and a MOS FET 9b is turned OFF in an output stage 17 of the gate driver 16, the gate potential of the IGBT 1 is a potential on the high-voltage side power line of the gate driver, the gate voltage of the IGBT 1 exceeds a threshold, whereby the IGBT 1 is put in its ON state. When the MOS FET 9a is turned OFF and the MOS FET 9b is turned ON, on the other hand, charges are pulled out from the gate of the IGBT 1 via a gate resistance 8 to the gate driver 16, so that the IGBT 1 is turned OFF and put in its OFF state. When the IGBT 1 is turned OFF, the collector voltage of the IGBT 1 rises, a clamping element 61a yields or is broken down, and a current flows therethrough and even into the gate driver 16.

At this time, a current branched to the reactor 28 is also increased. However, a voltage corresponding to a product of an increasing rate of the branched current and the inductance of the reactor 28 is applied between both ends of the reactor 28, so that a current branched to the gate driver 16 via the reactor 28 is limited. Accordingly, since more current is supplied to the gate of the IGBT 1, the IGBT can be protected more reliably from an overvoltage.

A time taken for a surge voltage to be applied to the IGBT is about 0.5 μs. When the current flowing into the gate driver is limited to about 8A, a relation, V=L*di/dt, is satisfied. Accordingly, when a voltage applied to the reactor is 15V, 15V=L*16A/1 μs and hence L≈1 μH. Thus when the inductance of the reactor 28 is set at 1 μH or a higher value, this is effective for the protection of the IGBT 1 from overvoltage.

Although the overvoltage protection circuit 65 is arranged in the form of a series circuit of clamping elements 61a, 61b and a resistor 62a in FIG. 3, the overvoltage protection circuit 65 may have such an arrangement as shown by the overvoltage protection circuit 65 in FIG. 1.

Embodiment 4

Figure 4:
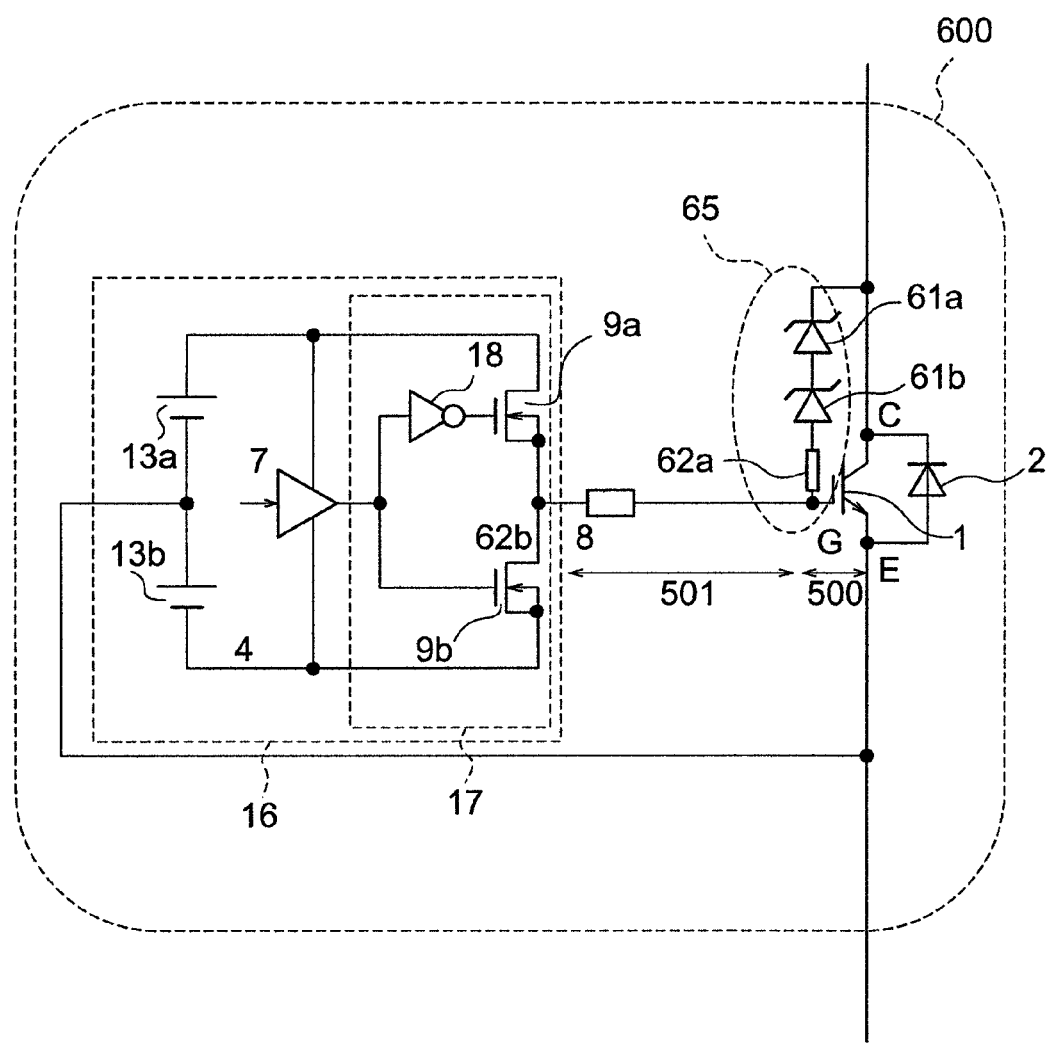
FIG. 4 shows a major part of an IGBT power conversion apparatus in accordance with a fourth embodiment of the present invention corresponding to one arm.

In a fourth embodiment, each arm 20 in FIG. 5 has such an arrangement as shown by the IGBT set 600 in FIG. 4. The fourth embodiment is featured in that a length 501 of wiring between an overvoltage protection circuit 65 and a gate driver 16 is much longer than a length 500 of wiring between the overvoltage protection circuit 65 and the gate of an IGBT 1. When the length 501 of wiring between the overvoltage protection circuit 65 and the gate driver 16 is longer, the parasitic inductance of the wiring can function similarly to the reactor 28 in the third embodiment. As a result the present embodiment can obtain effects similar to in the third embodiment.

Figure 7:
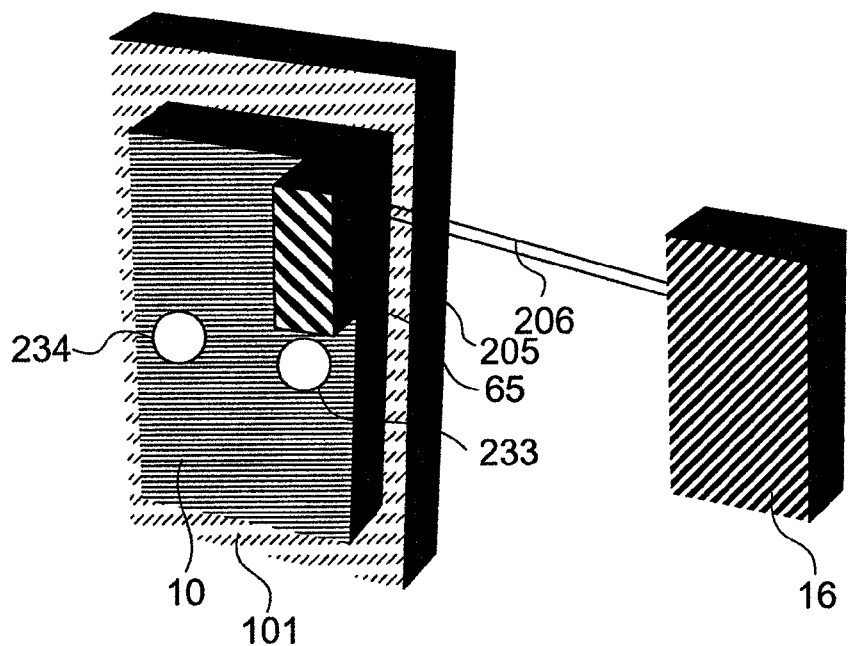
FIG. 7 shows a mounted state of the major part of the IGBT power conversion apparatus of the fourth embodiment of the invention corresponding to one arm.

FIG. 7 shows, in a model form, the IGBT set 600 of the present embodiment installed. A package 10 (which will be referred to as the IGBT package 10, hereinafter) incorporating the IGBT 1 and the clamp diode 2 is mounted on a cooling fin 101, and the overvoltage protection circuit 65 is mounted on the IGBT package 10. Although busbars connected to a collector terminal 234 and to an emitter terminal 233 are omitted in FIG. 7, the respective busbars are actually provided on the overvoltage protection circuit 65 (the overvoltage protection circuit 65 being provided between the busbars and the package of the IGBT 1). Wiring lines 205 and 206 are connected between the gate driver 16 ad the IGBT package 10, the length of wiring lines 205, 206, that is, the distance 501 of a wiring line between the overvoltage protection circuit 65 and the gate driver 16 is set to be much longer than the length 500 of a wiring line between the overvoltage protection circuit 65 and the gate of the IGBT 1. Thus the present embodiment can achieve effects similar to the embodiment 3. When the wiring length 501 between the overvoltage protection circuit 65 and the gate driver 16 is set not to be smaller than about 1 m in turnaround distance, the inductance becomes about 1 μH or more, thus enabling achievement of more remarkable effects.

Since the length of the wiring lines 205, 206 can be made long, the gate driver can be advantageously mounted at a desired position.

Although the overvoltage protection circuit 65 has such an arrangement as shown by a series circuit including the clamping elements 61a, 61b and the resistor 62b in FIG. 4, the overvoltage protection circuit 65 may have such an arrangement as shown by the overvoltage protection circuit 65 in FIG. 1.

Embodiment 5

Figure 6:
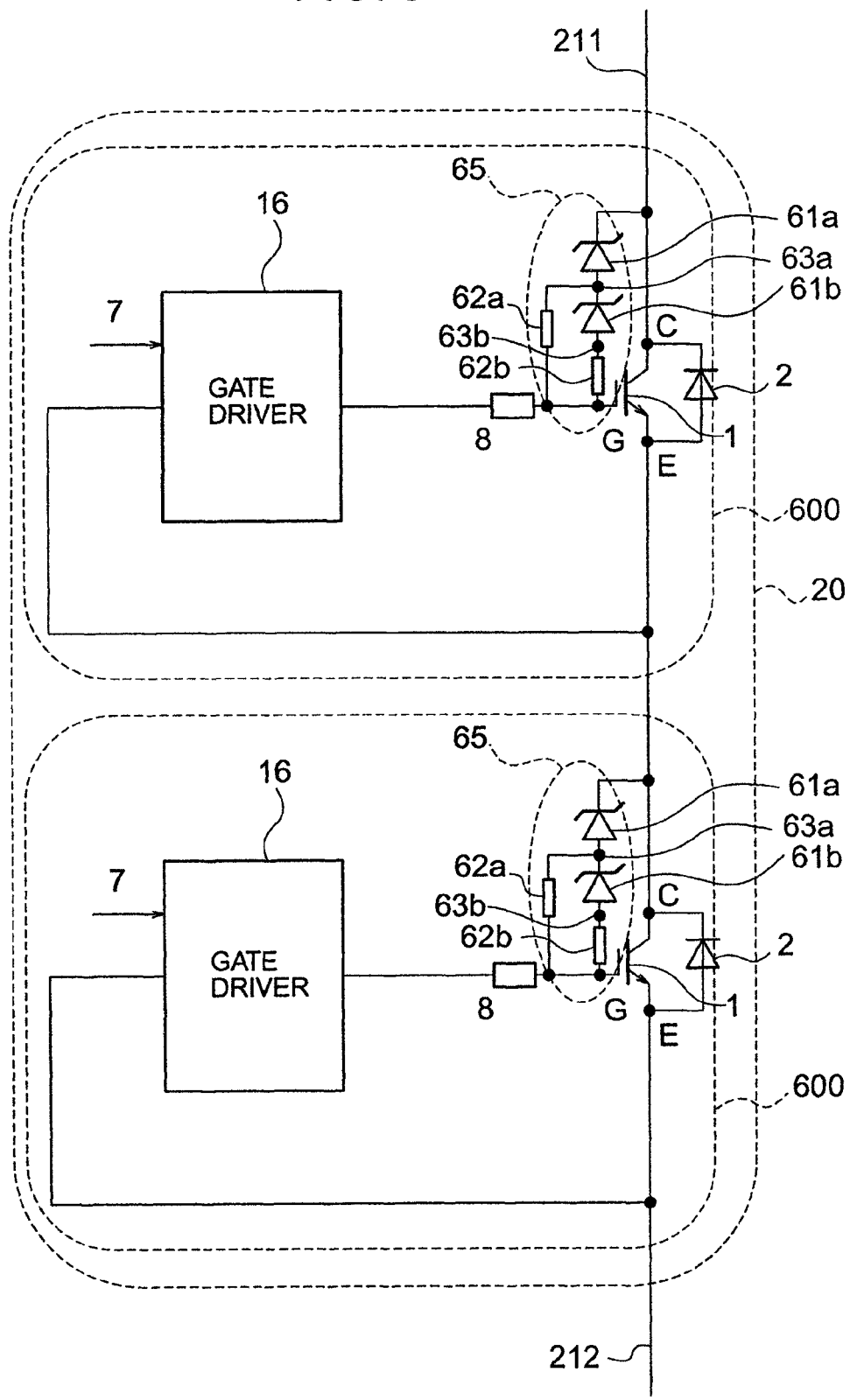
FIG. 6 shows a major part of an IGBT power conversion apparatus in accordance with a fifth embodiment of the present invention corresponding to one arm.

A fifth embodiment is featured by IGBTs 1 connected in series. FIG. 6 shows an arrangement of an arm 20 in the present embodiment. In the present embodiment, each arm 20 in FIG. 5 corresponds to two of the IGBT sets 600 of FIG. 6 connected in series.

When the IGBTs 1 are connected in series, variations in the characteristics of elements cause one of the elements first turned OFF to receive the DC voltage, possibly resulting in that the element may become defective. If the IGBT can be reliably protected from an overvoltage, then a power conversion apparatus having IGBTs connected in series as a converter can be operated without causing any IGBT element to become defective. Accordingly, the overvoltage protection function of the IGBT is highly required, in particular, for a conversion apparatus having IGBTs 1 connected in series as a converter.

Since the arrangement of each IGBT set 600 in FIG. 6 is the same as the arrangement of the IGBT set 600 in FIG. 1, the IGBT can be protected from an overvoltage.

Even when the arrangement of the IGBT set 600 is replaced by the arrangement of FIGS. 2 to 4, the IGBT 1 can be protected from the overvoltage as in the embodiments 2 to 4. Thus, the power conversion apparatus having the IGBTs connected in series as the converter can be operated without causing any IGBT element to become defective.

Embodiment 6

Figure 8:
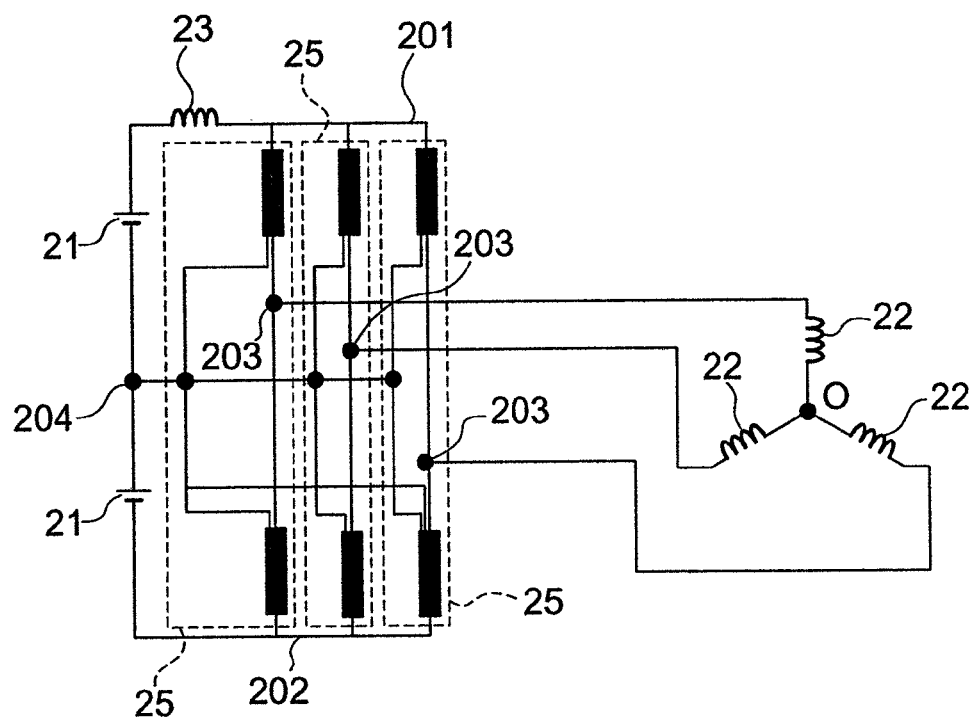
FIG. 8 shows a major part of an IGBT power conversion apparatus in accordance with a sixth embodiment of the present invention.

The arrangement of an upper/lower arm 25 in a power converter of the present embodiment is shown in FIG. 8. In the present embodiment, the power conversion apparatus is featured in that the apparatus is of a 3 level converter type. In a 2 level converter, when a P arm conductor is arranged to face an N arm conductor, compatibility can be achieved relatively easily between apparatus miniaturization and inductance reduction, and the gate driver 16 can be easily provided close to the IGBT 1.

Figure 10:
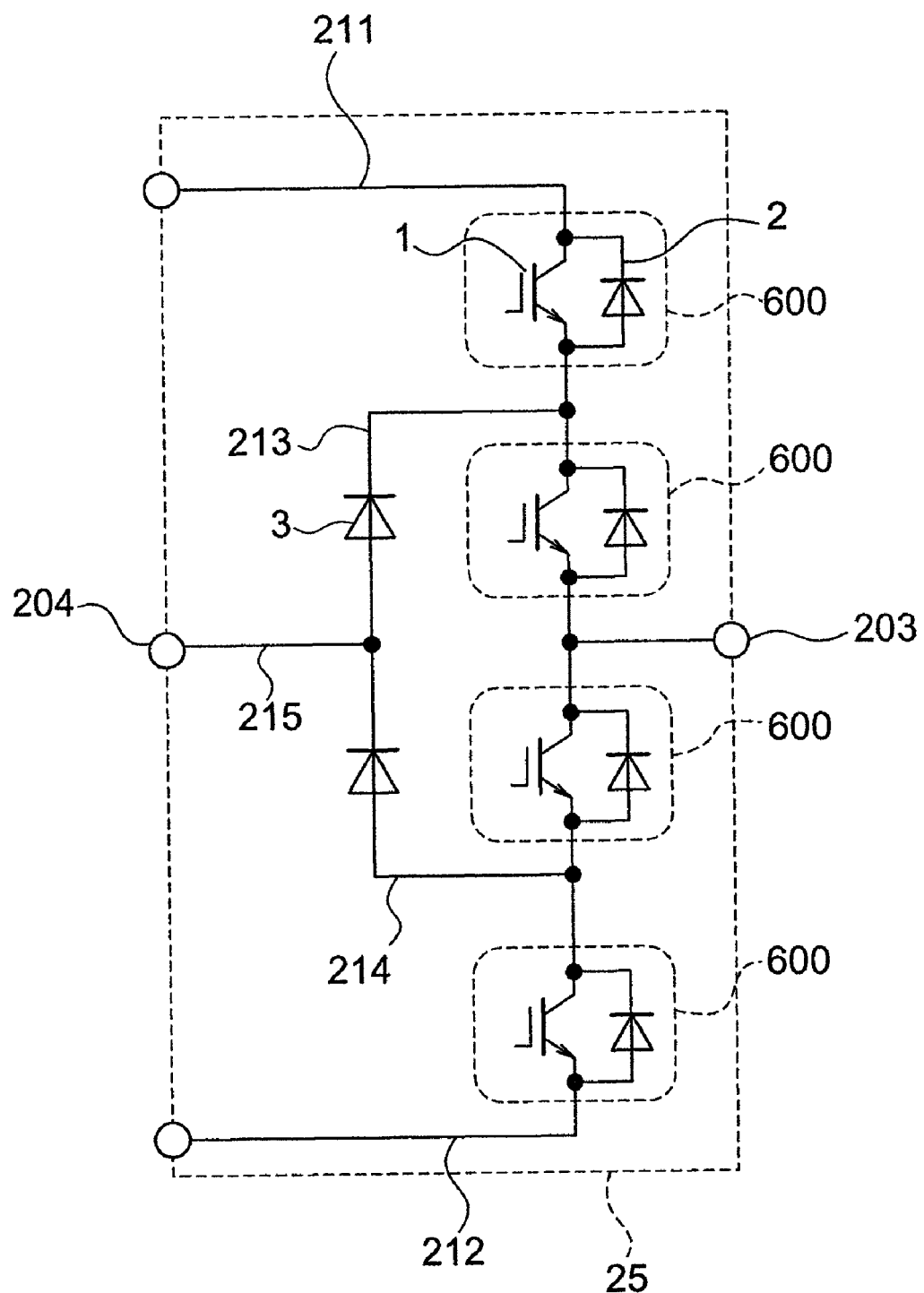
FIG. 10 shows a major part of an up/down arm in the IGBT power conversion apparatus of the sixth embodiment of the invention.
Figure 11:
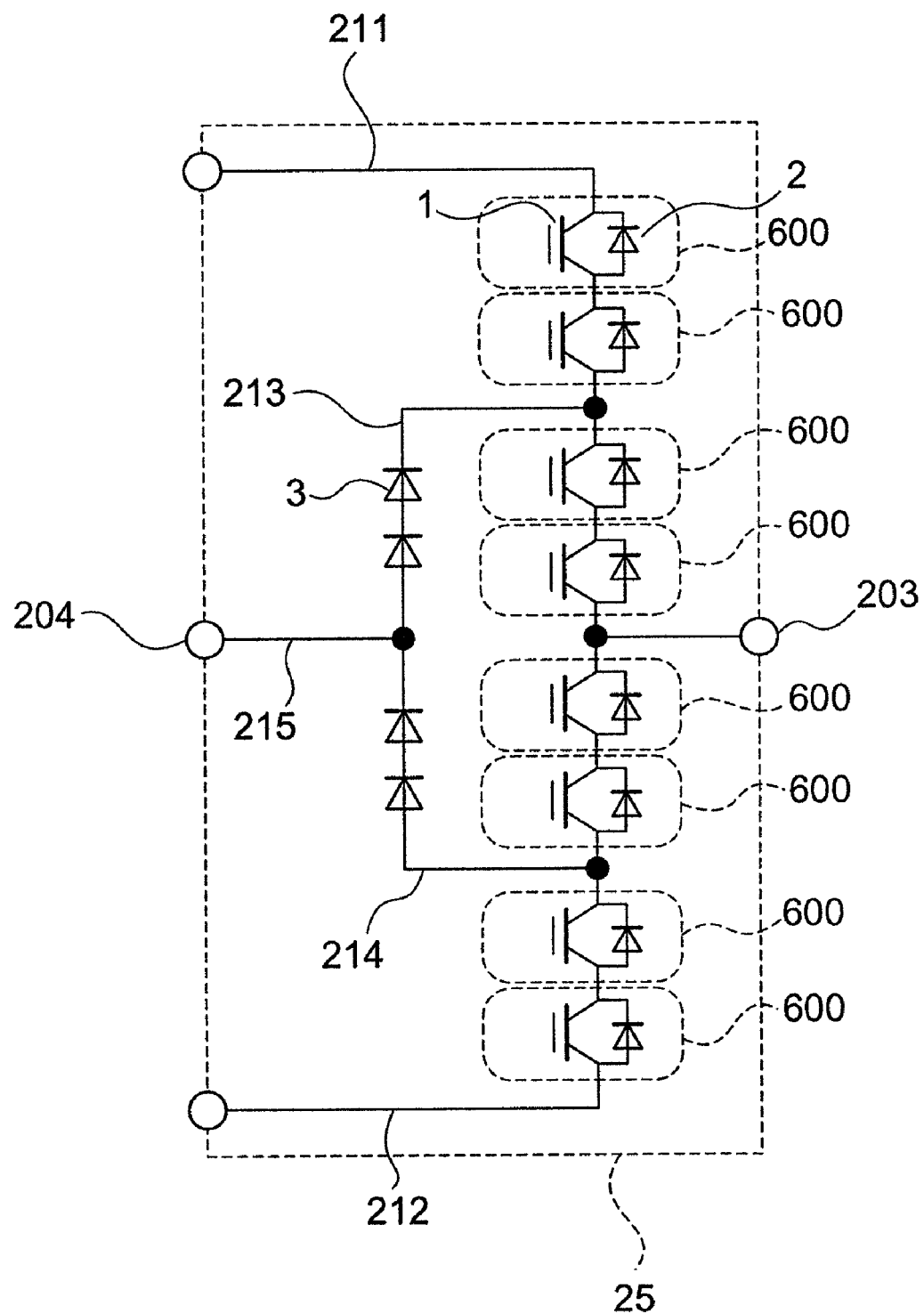
FIG. 11 shows a major part of the up/down arm in the IGBT power conversion apparatus of the sixth embodiment of the invention.

FIG. 10 shows an arrangement of the upper/lower arm 25 of the present embodiment. As shown in FIG. 11, since the 3 level inverter requires clamp diodes 3, this also requires other wiring lines 213 to 215 in addition to the wiring lines 211 and 212. Since mounting of such conductors becomes complicated, the inductance of the wiring lines becomes large and a surge voltage is easily applied to the IGBT. Accordingly, in order to protect the IGBT 1 from an overvoltage, it is necessary to supply more charging current than that of the 2 level converter to the gate of the IGBT 1.

For this reason, when the IGBT set 600 in FIG. 10 is designed to have such an arrangement as shown by the IGBT set 600 in FIGS. 1 to 4, the IGBT can be protected from the overvoltage.

When the IGBT set 600 is designed to have such an arrangement as in FIG. 4 as an example, the length of the wiring line 501 can be made long and the gate driver 16 of the IGBT 1 can be installed at a location away from the IGBT 1. As a result, a degree of mounting flexibility can be increased, the inductance of the conductor can be easily reduced, and the IGBT can be easily protected from the overvoltage.

Even when the power conversion apparatus is of the 3 level converter type and has the IGBTs 1 connected in series as in FIG. 11, the arrangement of the IGBT set 600 as in FIGS. 1 to 4 enables the IGBT to be protected from the overvoltage.

In accordance with the present invention, there is provided a semiconductor power conversion apparatus which can suppress an overvoltage, in particular, upon switching operation.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor power conversion apparatus including an Insulated Gate Bipolar Transistor (IGBT) type semiconductor, comprising:
   an overvoltage protection circuit connected between a collector of the IGBT type semiconductor and a gate thereof,
   wherein the overvoltage protection circuit includes a plurality of clamping elements connected in series with breakdown directions thereof aligned in the same direction, a cathode side terminal of the series connected plurality of clamping elements being connected to the collector of the IGBT type semiconductor, while an anode side terminal of the series connected plurality of clamping elements being connected to the gate of the IGBT type semiconductor,
   a first resistor disposed to form a direct connection therethrough between the gate of the IGBT type semiconductor and a junction conductor that interconnects the plurality of series connected clamping elements, the first resistor being connected such that when a collector-gate voltage of the IGBT type semiconductor exceeds a first breakdown voltage relating to a part of the plurality of the clamping elements that is disposed on the collector side of the IGBT type semiconductor, a current flows from the junction conductor through the first resistor, and
   a second resistor directly connected at one end thereof to the gate of the IGBT type semiconductor and at a second end thereof to the junction conductor via another part of the plurality of the clamping elements that is disposed on the gate side of the IGBT type semiconductor between the gate of the IGBT type semiconductor and the junction conductor, the second resistor being connected such that when a collector-gate voltage of the IGBT type semiconductor exceeds a sum of the breakdown voltages relating to the plurality of the clamping elements, a current flows from the second resistor via the another part of the plurality of clamping elements that is disposed on the gate side of the IGBT type semiconductor, in addition to the current flowing from the first resistor, wherein the second resistor is set to a resistive value larger than that of the first resistor.

2. A power conversion apparatus including a plurality of series-connected semiconductor power conversion elements each including an Insulated Gate Bipolar Transistor (IGBT) type semiconductor, comprising:
   an overvoltage protection circuit connected between a collector of the IGBT type semiconductor and a gate thereof of each IGBT,
   wherein the overvoltage protection circuit includes a plurality of clamping elements connected in series with breakdown directions thereof aligned in the same direction, a cathode side terminal of the series connected plurality of clamping elements being connected to the collector of the IGBT type semiconductor, while an anode side terminal of the series connected plurality of clamping elements being connected to the gate of the IGBT type semiconductor,
   a first resistor disposed to form a direct connection therethrough between the gate of the IGBT type semiconductor and a junction conductor that interconnects the plurality of series connected clamping elements, the first resistor being connected such that when a collector-gate voltage of the IGBT type semiconductor exceeds a first breakdown voltage relating to a part of the plurality of the clamping elements that is disposed on the collector side of the IGBT type semiconductor, a current flows from the junction conductor through the first resistor,
   a second resistor directly connected at one end thereof to the gate of the IGBT type semiconductor and at a second end thereof to the junction conductor via another part of the plurality of the clamping elements that is disposed on the gate side of the IGBT type semiconductor between the gate of the IGBT type semiconductor and the junction conductor, the second resistor being connected such that when a collector-gate voltage of the IGBT type semiconductor exceeds a sum of the breakdown voltages relating to the plurality of the clamping elements, a current flows from the second resistor via the another part of the plurality of clamping elements that is disposed on the gate side of the IGBT type semiconductor, in addition to the current flowing from the first resistor, and
   wherein the series-connected semiconductor power conversion elements are arranged such that the collector of a first IGBT type semiconductor is connected to an emitter of a second IGBT type semiconductor.

3. A power conversion apparatus according to claim 2, wherein the series-connected semiconductor power conversion elements constitute a single arm of a multi-phase power converter.

4. A power conversion apparatus according to claim 2, wherein the series-connected semiconductor power conversion elements constitute either a power pull-up or power pull-down section of a power converter.

5. A power conversion apparatus comprising serially connected four sets each having a plurality of series-connected semiconductor power conversion elements according to claim 2, the four sets being a first set, a second set, a third set and a fourth set, which are in a single series connection, in that order,
   wherein predetermined potentials are given to respective points of the apparatus as follows:
   (a) the open-end point of the first set,
   (b) the open-end point of the fourth set,
   (c) the node connecting the first set and the second set,
   (d) the node connecting the third set and the fourth set, and
   (e) the node connecting the second set and the third set being an output node.

6. A semiconductor power conversion apparatus including an Insulated Gate Bipolar Transistor (IGBT) type semiconductor, comprising:
   an overvoltage protection circuit connected between a collector of the IGBT type semiconductor and a gate thereof,
   wherein the overvoltage protection circuit includes a plurality of clamping elements connected in series with breakdown directions thereof aligned in the same direction, a cathode side terminal of the series connected plurality of clamping elements being connected to the collector of the IGBT type semiconductor, while an anode side terminal of the series connected plurality of clamping elements being connected to the gate of the IGBT type semiconductor,
   a first resistor disposed to form a direct connection therethrough between the gate of the IGBT type semiconductor and a junction conductor that interconnects the plurality of series connected clamping elements, the first resistor being connected such that when a collector-gate voltage of the IGBT type semiconductor exceeds a first breakdown voltage relating to a part of the plurality of the clamping elements that is disposed on the collector side of the IGBT type semiconductor, a current flows from the junction conductor through the first resistor, a second resistor directly connected at one end thereof to the gate of the IGBT type semiconductor and at a second end thereof to the junction conductor via another part of the plurality of the clamping elements that is disposed on the gate side of the IGBT type semiconductor between the gate of the IGBT type semiconductor and the junction conductor, the second resistor being connected such that when a collector-gate voltage of the IGBT type semiconductor exceeds a sum of the breakdown voltages relating to the plurality of the clamping elements, a current flows from the second resistor via the another part of the plurality of clamping elements that is disposed on the gate side of the IGBT type semiconductor, in addition to the current flowing from the first resistor, wherein the IGBT type semiconductor is separated from a gate driver corresponding thereto via an impedance, and wherein the overvoltage protection circuit is mounted to be adjacent to the IGBT type semiconductor.

\* \* \* \* \*